United States Patent [19]
Yamadera et al.

[11] Patent Number: 5,625,218
[45] Date of Patent: Apr. 29, 1997

[54] SEMICONDUCTOR DEVICE EQUIPPED WITH A HEAT-FUSIBLE THIN FILM RESISTOR AND PRODUCTION METHOD THEREOF

[75] Inventors: Hideya Yamadera; Takeshi Ohwaki; Yasunori Taga, all of Nagoya; Makio Iida, Ichinomiya; Makoto Ohkawa, Toyoake; Hirofumi Abe, Okazaki; Yoshihiko Isobe, Toyoake, all of Japan

[73] Assignees: Nippondenso Co., Ltd., Kariya; Kabushiki Kaisha Toyota Chuo Kenkyusho, Aichi, both of Japan

[21] Appl. No.: 491,543

[22] Filed: Jun. 16, 1995

[30] Foreign Application Priority Data

Jun. 17, 1994 [JP] Japan ................. 6-135706

[51] Int. Cl.[6] ............................. H01L 27/10; H01L 29/00
[52] U.S. Cl. ........................ 257/529; 257/208; 257/209; 257/528; 257/536
[58] Field of Search ............................. 257/50, 529, 530, 257/209, 536, 528

[56] References Cited

FOREIGN PATENT DOCUMENTS

| | | |
|---|---|---|
| 3106055 | 5/1991 | Japan . |
| 3242966 | 10/1991 | Japan . |
| 661353 | 3/1994 | Japan . |

*Primary Examiner*—Mahshid D. Saadat
*Assistant Examiner*—Valencia Martin Wallace
*Attorney, Agent, or Firm*—Cushman, Darby & Cushman

[57] ABSTRACT

A fuse fusible type semiconductor device capable of reducing energy required for fusing and a production method of the semiconductor device. In a semiconductor device equipped with a heat-fusible thin film resistor, the thin film resistor formed on a substrate 1 through an insulating film 2 is made of chromium, silicon and tungsten, and films 7 and 8 of a insulator including silicon laminated on the upper surface of the fusing surface, aluminum films 5 are disposed on both sides of the fusing surface and a barrier film 4. This semiconductor device is produced by a lamination step of sequentially forming a first insulating film 2, a thin film resistor 3, a barrier film 4 and an aluminum film 5 on a substrate 1 for reducing drastically fusing energy, an etching step of removing the barrier film 4 and the aluminum film 5 from the fusing region 31 of the thin film resistor 3, and an oxide film formation step of depositing the insulator including silicon films 7 and 8.

21 Claims, 3 Drawing Sheets

SEMICONDUCTOR DEVICE EQUIPPED WITH A HEAT-FUSIBLE THIN FILM RESISTOR AND PRODUCTION METHOD THEREOF

BACKGROUND OF THE INVENTION

1. Field of the Invention

This invention relates to a semiconductor device equipped with a heat-fusible thin film resistor, and to a method of producing such a semiconductor device.

2. Description of the Related Art

A semiconductor device including a thin film resistor consisting of a chromium silicon (CrSi) type film and covered with a insulator including silicon film is known as a semiconductor device equipped with a heat-fusible thin film resistor (refer to Japanese Unexamined Patent Publication (Kokai) No. 3-106055). A semiconductor device having a structure including thin film resistor consisting of a chromium silicon (CrSi) type film and a metal oxide layer for lowering a fusing temperature of this thin film resistor, laminated on the thin film resistor, is also known (refer to Japanese Unexamined Patent Publication (Kokai) No. 6-61353).

The semiconductor device described above, wherein the thin film resistor consisting of the chromium silicon (CrSi) type film is covered with the insulator including silicon film, has excellent characteristics as a fuse fusible type semiconductor device including that it exhibits a small volume change at the time of fusing.

In such a fuse fusible type semiconductor device, however, energy required for fusing is great, and thermal losses such as cracks occurring in the insulation film including silicon covering the surface of the semiconductor device, and deterioration of thermal characteristics, are likely to occur. Energy necessary for fusing can be lowered by laminating a metal oxide on the thin film resistor, but the resulting fusing temperature is not sufficiently lowered and further lowering is necessary.

In view of the technical background described above, the present invention is directed to provide a fuse fusible type semiconductor device which requires less energy for fusing than conventional fuse fusible type semiconductor devices, but which does not cause thermal losses and deterioration of thermal characteristics such as cracks in an insulator including silicon covering the surface.

SUMMARY OF THE INVENTION

As a result of intensive studies in search for various fuse materials, the inventors of the present invention have discovered a thin film resistor capable of drastically reducing fusing energy when used as a thin film resistor, and have completed the present invention.

The semiconductor device, according to the present invention, comprises a silicon substrate; a first insulator film formed on said silicon substrate, being made of a insulator including silicon; a thin film resistor formed on said first insulator film, as a fuse, comprising chromium, silicon and tungsten; a wiring portion formed on said thin film resistor, being made of aluminum or an alloy thereof; and a passivation film formed in contact with said wiring portion and said thin film resistor, being made of at least one compound selected from a silicon nitride and a insulator including silicon.

A method of producing a semiconductor device according to the present invention comprises the steps of: a lamination step of sequentially forming, on a semiconductor substrate through a first insulator film, a thin film resistor comprising chromium, silicon, and tungsten as a fuse and a film for wiring made of aluminum or an alloy thereof; an etching step of removing said film for wiring laminated on said thin film resistor by etching; and a passivation step of depositing a passivation film on the surface of the laminate subjected to said etching treatment, said passivation film being made of at least one compound selected from a silicon nitride and an insulator including silicon.

One of the characterizing features of the semiconductor device according to the present invention resides in that the heat-fusible thin film resistor is made of chromium, silicon and tungsten. When tungsten is added to a thin film resistor made of chromium-silicon, an amorphous ternary alloy is formed and its melting point lowers. For this reason, the thin film resistor made of chromium, silicon and tungsten can drastically reduce the thermal energy required to fuse the thin film resistor. As a result, the thermal stress applied to the insulation film including silicon covering the upper surface of the thin film resistor can be reduced, and the occurrence of cracks and the deterioration of thermal characteristics can be prevented.

When the crystal structure of the cross section of the thin film resistor fused by the feed of power is analyzed by a transmission electron microscope, it is observed that an intermetallic compound having a high melting point, i.e. $Cr_3Si$, precipitates in the case of the conventional chromium-silicon thin film resistor. In the case of the chromium-silicon-tungsten thin film resistor according to the present invention, on the other hand, an intermetallic compound having a low melting point, i.e. $CrSi_2$, precipitates. It is presumed from this fact that when tungsten is added to chromium-silicon to form an amorphous ternary alloy, a crystalline intermetallic compound having a low melting point is formed by heating, and cutoff of the current occurs at a portion of fusion or sublimation of this intermetallic compound. As a result, the total energy required for fusing is believed to drastically drop.

It could be understood from the above description that the thin film resistor of the present invention can reduce the thermal energy required for fusion and can decrease the thermal stress imparted to the insulator including silicon such as the silicon nitride film covering the upper surface of the thin film resistor, thereby preventing deterioration, in comparison with the conventional chromium-silicon thin film resistor.

The chromium-silicon-tungsten thin film resistor contains at least 20 to 50 atm % of chromium, at least 1 to 20 atm %, preferably 2 to 14 atm %, of tungsten, and the balance of silicon.

This chromium-silicon-tungsten film preferably has a composition capable of precipitating an intermetallic compound having a low melting point at the time of heat-fusion, from the aspect of its object. Small quantities of additives such as oxygen, nitrogen, and so forth, may be contained in this chromium-silicon-tungsten film.

Besides the silicon oxide film ($SiO_x$), PSG (phosphosilicate glass), BSG (borosilicate glass), BPSG (borophosphosilicate glass), etc., can be used as the insulator including silicon film to be formed on the upper surface of the thin film resistor. Further, SiN (silicon nitride) can be employed, too. Though this insulator including silicon film is preferably disposed on both upper and lower surfaces of the thin film resistor in contact therewith, it may be disposed on at least one of the surfaces.

The semiconductor device according to the present invention can be produced by sequentially forming the thin film resistor, the barrier film made of a tungsten alloy, and the aluminum film for wiring on the substrate through a first insulating film, then removing the barrier film and the aluminum film on the fusing region of the thin film resistor by etching, and forming the insulator including silicon film on the surface of the laminate subjected to the etching treatment.

The barrier film made of the tungsten alloy and disposed on both sides of the fusing opening portion of the upper surface of the thin film resistor preferably uses an alloy containing at least 5 to 50 atm % of tungsten and the balance of a metal. Small amounts of other additives may be contained in the barrier film.

In the semiconductor device according to the present invention, the chromium-silicon-tungsten film constituting the thin film resistor can be heat-fused at a lower level of energy. Though this fusing mechanism has not yet been clarified, the intermetallic compound having a low melting point, i.e. $CrSi_2$, is found formed from the observation of the section of the thin film resistor after heat-fusion. On the other hand, an intermetallic compound having a high melting point, i.e. $Cr_3Si$, precipitates as revealed through the observation of the cross section of the chromium-silicon thin film resistor according to the prior art. It is presumed that the existence of tungsten promotes the formation of an amorphous alloy in the thin film resistor which turns into the intermetallic compound of the low melting product by heating, so that the fusing can be performed at a lower level of fusing energy. As a result, fusing energy required for fusing the fuse can be drastically reduced in comparison with the chromium-silicon thin film resistor according to the prior art. Since the required fusing energy is small, the semiconductor device according to the present invention has small thermal defects such as cracks of the protective film, has high reliability and long durability, and is easy to handle because the range of the fusing voltage is broad.

DESCRIPTION OF THE PREFERRED EMBODIMENTS

Figure 1:
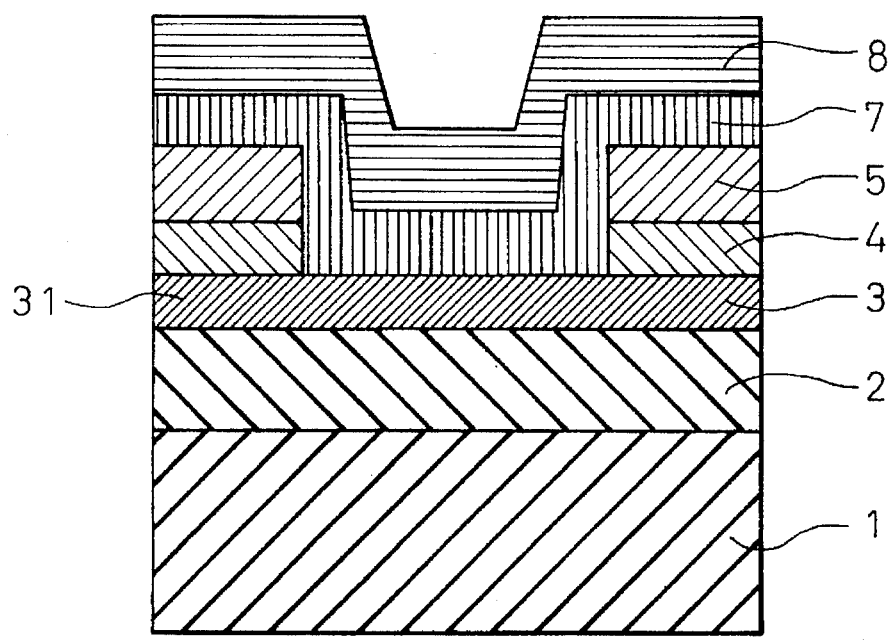
FIG. 1 is a sectional view showing an embodiment of the apparatus of the present invention.

FIG. 1 is a sectional view of a semiconductor device equipped with a heat-fusible thin film resistor to which the present invention is applied.

This semiconductor device comprises a silicon substrate 1, a silicon oxide film 2 formed on this silicon substrate 1, a fuse 3 of a thin film resistor consisting of a chromium-silicon-tungsten film formed on the silicon oxide film 2, a barrier metal portion 4 and an aluminum wiring portion 5 formed in lamination on both sides of a fusing region 31 of this fuse 3, a PSG film 7 formed on these barrier metal portion 4, aluminum wiring portion 5 and fusing region 31 of the fuse 3, and a silicon nitride film (SiN) 8 for passivation, formed on this PSG film 7.

The semiconductor device equipped with this thin film resistor was produced through the following production steps.

First, a 1.2 μm-thick silicon oxide film 2 was formed as a base insulating film on the silicon substrate 1 by an oxidization process. The silicon dioxide film 2 may be formed by a CVD process in place of the oxidization method. Next, a 0.015 μm-thick chromium-silicon-tungsten film was formed on this silicon dioxide film 2 by a PVD process and was then etched into a predetermined shape so as to obtain the fuse 3 (heat-fusible thin film resistor).

A composite insulating film consisting of a silicon nitride layer as a lower layer and a silicon oxide film as an upper layer may be used as the base insulating film, and boron or phosphorus may be doped into the silicon oxide film. The chromium-silicon-tungsten film has a composition consisting of 29 atm % of Cr, 65 atm % of Si and 6 atm % of W.

Figure 2:
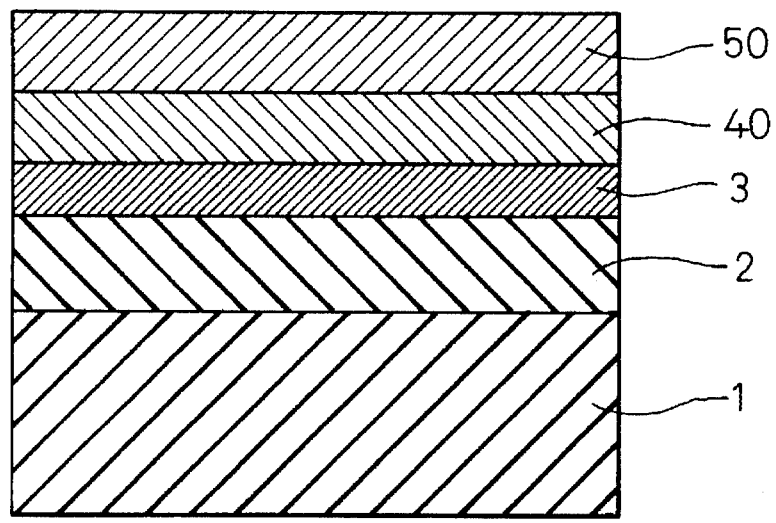
FIG. 2 is a sectional view showing a production process of FIG. 1.

Next, a 0.15 μm-thick titanium tungsten (TiW) alloy film 40 was formed by the PVD process, and a 1.1 μm-thick aluminum film 50 was formed on the TiW alloy film 40 by the PVD process. FIG. 2 shows the cross section of the resulting laminate. By the way, the titanium tungsten alloy film 40 has a composition consisting of 90 atm % of Ti and 10 atm % of W.

A photoresist was disposed on the aluminum film 50, and only the titanium tungsten alloy film 40 and the aluminum film 50 were wet etched by using a mask obtained by opening the resist by photolithography.

Figure 3:
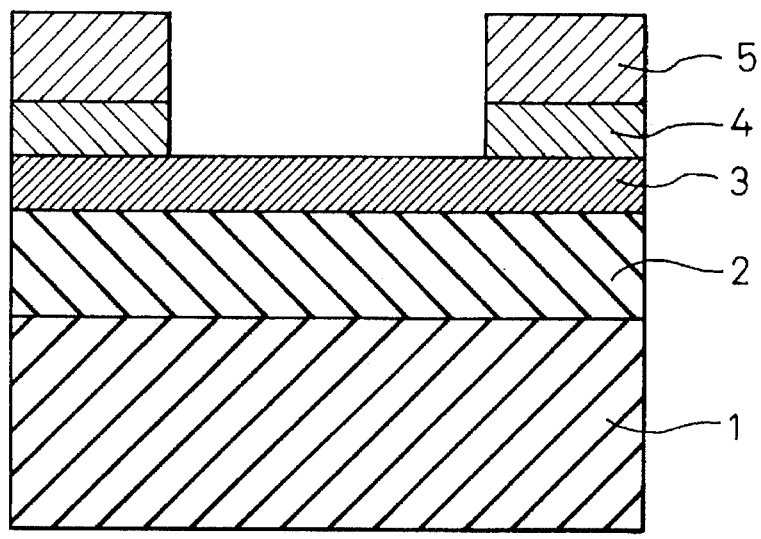
FIG. 3 is a sectional view showing a production process of FIG. 1.

In this way, the aluminum wiring portions 5 were formed on both end portions of the fuse 3 in such a manner as to interpose the barrier metal portion 4 made of titanium tungsten between them (see FIG. 3).

Next, as shown in FIG. 1, a 0.4 μm-thick PSG film 7 was formed by the CVD process and a 0.5 μm-thick silicon nitride (SiN) film 8 was formed by a plasma CVD process. Pad portions (not shown) were then formed by selective opening of these films 7 and 8, and wire bonding was carried out to the pad portions. The semiconductor device of this embodiment was produced through a series of these process steps.

COMPARATIVE EXAMPLE 1

A semiconductor device of Comparative Example 1 having the same structure as that of the semiconductor device of this embodiment was produced in the same way as described above with the exception that a chromium silicon film was used for the fuse 3 of the thin film resistor in place of the chromium-silicon-tungsten film.

Evaluation

Figure 4:
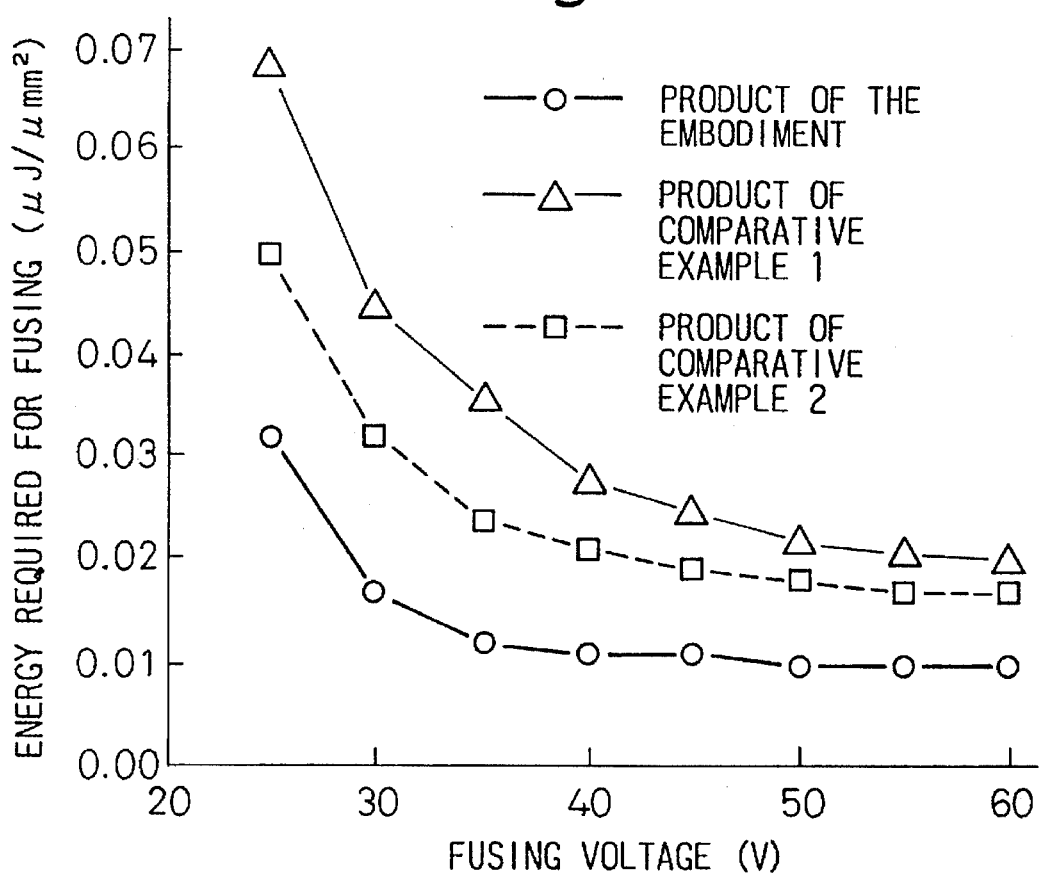
FIG. 4 is a characteristic diagram showing the relation between energy necessary for fusing and an impressed voltage of the embodiment of the present invention and a comparative example.

Energy necessary for fusing was measured for the semiconductor device of this embodiment and the semiconductor device of Comparative Example 1, and fusing performances of both the fuses 3 were comparatively examined. FIG. 4 shows the result of this measurement test. The fusing region 31 of each of these semiconductor devices had a thickness of 0.015 μm, a length of 9.6 μm and a width of 6.4 μm.

The ordinate in FIG. 4 represents input energy per unit area of the fusing region expressed by input power (fusing voltage×feed current×pulse feed time×number of pulses) which was measured by a power meter in the test. The pulse feed time was kept constant (here, 1 microsecond). The abscissa represents a fusing voltage.

It can be seen from FIG. 4 that input energy drops when the fusing voltage is increased, but at a low fusing voltage, the energy necessary for fusing is extremely smaller in the product of this embodiment than in the product of Comparative Example 1. Accordingly, the product of this embodiment can by far greatly reduce the energy necessary for fusing than the product of Comparative Example 1.

The section of the fusing region 31 of each of these two semiconductor devices was observed by a transmission electron microscope so as to analyze the crystal structure. As a result, precipitation of an intermetallic compound, i.e. $CrSi_2$, having a low melting point was observed in the fuse 3 of the semiconductor device of this embodiment. On the other hand, precipitation of an intermetallic compound, i.e. $Cr_3Si$, having a high melting point was observed in the fuse 3 of the semiconductor device of Comparative Example 1.

In consideration of the observation result of the cross section by the transmission electron microscope, etc., it is estimated that such lowering of the melting point of the fuse 3 results from the following fact. Namely, the intermetallic compound precipitated upon heating due to the feed of power to the fuse 3 has a lower melting point in the product of this embodiment due to the tungsten content than that in the product of Comparative Example, and this remarkably reduces energy at the time of fusion and evaporation in comparison with the product of Comparative Example 1.

As described above, the product of this embodiment can by far greatly reduce the energy necessary for fusion than that required by the product of Comparative Example 1. Therefore, the product of this embodiment can drastically reduce the thermal stress imparted to various films constituting the semiconductor device, particularly, the SiN film 8, and it is expected that cracks of the SiN film 8, etc., can be drastically reduced.

In order to evidence the assumption described above, the minimum voltage capable of fusing without the occurrence of cracks was examined for the product of this embodiment and the product of Comparative Example 1 by changing the impressed voltage. The occurrence of cracks was examined by a Caros test. By the way, when the impressed voltage to the fuse 3 is lowered, the feed current becomes small, and thermal energy occurring at the fuse portion per unit time becomes small. Therefore, the temperature rise rate of the fuse becomes gentle, and the time necessary for fusing becomes elongated. As a result, the quantity of heat of the fuse portion transferred to the PSG and the SiN film 8 by heat conduction becomes great, and cracks are more likely to occur in the SiN film 8. In other words, energy necessary for fusing, which increases due to a low voltage, is believed to correspond to energy diffused to the PSG and the SiN film 8.

When a high voltage is impressed, on the contrary, the temperature rise rate of the fuse 3 is high and fusion occurs within a short time. Consequently, the diffusion quantity of the resulting energy to the PSG and the SiN film 8 becomes small, and fusion of the fuse 3 can be effectively conducted.

When the application of the present invention to practical devices is taken into consideration, it is advantageous that the fusing voltage of the fuse is low, because when a large voltage is applied, other devices are likely to be destroyed in some cases.

The results of experiments revealed that the maximum fusible voltage without the occurrence of cracks was 30 V in the product of this embodiment and was 75 V in the product of Comparative Example 1. Accordingly, in the product of this embodiment wherein fusion occurs at a low temperature, the occurrence of cracks can be suppressed even when a low voltage is impressed for fusing.

COMPARATIVE EXAMPLE 2

Figure 5:
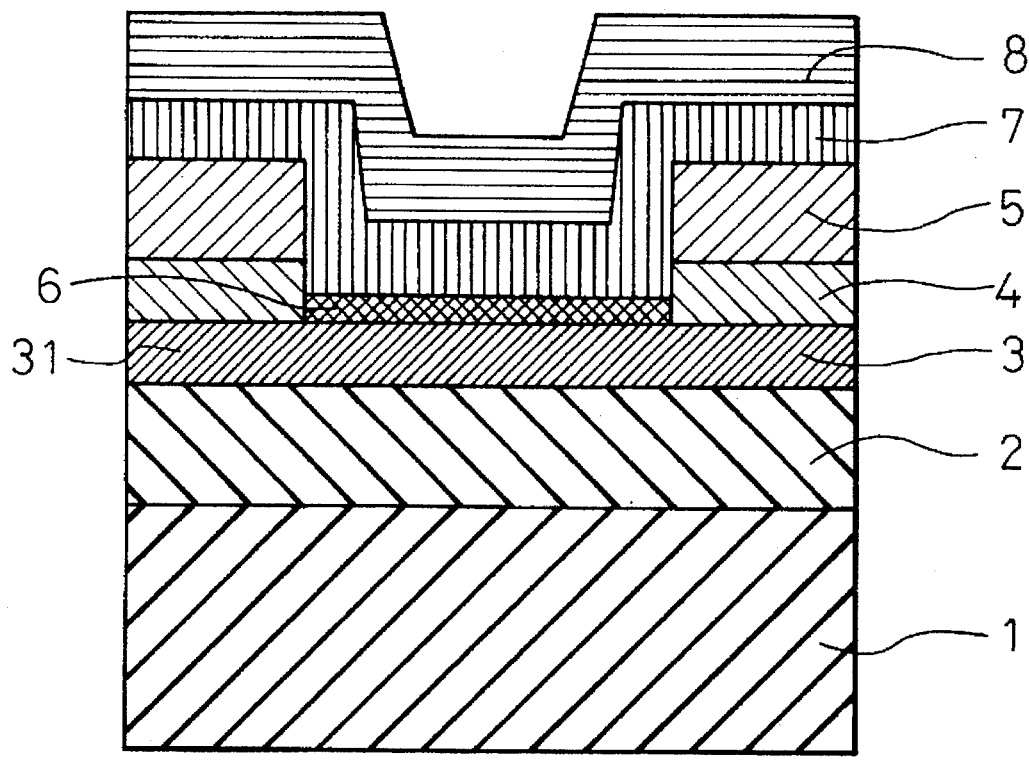
FIG. 5 is a sectional view showing an apparatus of Comparative Example 2.

In the semiconductor device, the product of Comparative Example 2 is produced in the same way as the product of Comparative Example 1 with the exception that a tungsten oxide film 6 is interposed between the fuse 3 and the PSG film 7 instead of directly adding tungsten to the thin film resistor. FIG. 5 shows the section of the semiconductor device so produced. The fusion characteristics of this Comparative Example 2 is a mixture between the characteristics of the product of the embodiment of the present invention and those of the product of Comparative Example 1. Though energy necessary for fusing is lower than that of the product of Comparative Example 1, the product of Comparative Example 2 obviously requires greater energy for fusing than the product of the embodiment of the present invention.

The maximum fusible voltage without the occurrence of cracks was 50 V in the product of this Comparative Example 2, and was higher than 30 V in the product of the embodiment of the present invention.

In comparison with Comparative Example 2 wherein the tungsten oxide is laminated on the chromium-silicon thin film resistor, the ternary alloy prepared by adding tungsten to the chromium-silicon thin film resistor of this embodiment, that is, the chromium-silicon-tungsten thin film resistor, can further reduce energy required for fusing.

As a result of the studies on the energy reduction effect made by the present inventors, it has been found out that in the case of the thin film resistor according to this embodiment, the intermetallic compound ($CrSi_2$) having a low melting point starts occuring at arbitrary positions of the thin film resistor substantially simultaneously with heating. It is therefore presumed that the thin film resistor is heated and fused instantaneously at a low level of fusing energy.

In contrast, the thin film resistor of Comparative Example 2 is not heated and fused so instantaneously as in this embodiment. It is presumed that the tungsten oxide is molten from the interface of chromium, silicon and tungsten oxide and this melting phenomenon greatly affects fusing. Further studies on this phenomenon reveal the following fact. In the structure of Comparative Example 2, as also disclosed in Japanese Unexamined Patent Publication (Kokai) No. 6-61353, the intermetallic compound ($CrSi_2$) having a low melting point starts being formed gradually from near the interface to which the tungsten oxide mixes, but a certain period of time is necessary before the whole tungsten oxide is molten into the thin film resistor. Therefore, lowering of the melting point of the thin film resistor is impeded immediately after heating, due to the portions unmixed with the tungsten oxide, and this impedes sufficient lowering of the melting point of the thin film resistor.

As described above, the fuse device of this embodiment can be fused at a lower level of energy than the prior art devices, and has less occurrence of cracks but high reliability. Further, the minimum voltage that can be applied is low and the input energy quantity is small. Therefore, the fuse device is easier to handle.

What is claimed is:

1. A semiconductor device having a fuse whose state can be changed by an application of fusing energy, said device comprising:

a silicon substrate;

a first insulator film formed on said silicon substrate, being made of a silicon type oxide;

a thin film resistor formed on said first insulator film, as said fuse, comprising chromium, silicon and tungsten before application of fusing energy;

a wiring portion formed over a portion of said thin film resistor, being made of aluminum or an alloy thereof; and a passivation film formed over said wiring portion and said thin film resistor, being made of at least one compound selected from a silicon nitride and an insulator including silicon.

2. A semiconductor device as defined by claim 1, further comprising a barrier film disposed between said portion of said thin film resistor and said wiring portion, said barrier film being made of tungsten or an alloy thereof.

3. A semiconductor device as defined by claim 1, further comprising a continuously extending second insulator film disposed between said passivation film and said wiring portion and between said passivation film and said thin film resistor except said portion of said thin film resistor, said second insulator film being made of an insulator including silicon.

4. A semiconductor device as defined by claim 1, wherein said thin film resistor is made of an amorphous substance.

5. A semiconductor device as defined by claim 1, wherein said thin film resistor contains chromium in a range between 20 and 50 atm % and tungsten in a range between 1 and 20 atm %.

6. A semiconductor device as defined by claim 5, wherein said thin film resistor contains chromium in a range between 20 and 50 atm % and tungsten in a range between 2 and 14 atm %.

7. A semiconductor device as defined by claim 2, wherein said barrier film contains tungsten in a range between 5 and 50 atm %.

8. A semiconductor device as defined by claim 1, wherein said first insulator film and said passivation film are made of a insulator including silicon selected from a group of $SiO_x$, PSG, BSG, BPSG and SiN.

9. A semiconductor device as defined by claim 3, wherein said second insulator film is made of a insulator including silicon selected from a group of $SiO_x$, PSG, BSG, BPSG and SiN.

10. A method of producing a semiconductor device having a fuse whose state can be changed by an application of fusing energy, said method comprising the steps of:

a lamination step of sequentially forming, over a semiconductor substrate through a first insulator film, a thin film resistor comprising chromium, silicon, and tungsten as said fuse before application of fusing energy, and a film wiring being made of aluminum or an alloy thereof;

an etching step of removing a portion of said film for wiring laminated on said thin film resistor by etching; and a passivation step of depositing a passivation film over the surface of the laminate subjected to said etching treatment, said passivation film being made of at least one compound selected from a silicon nitride and an insulator including silicon.

11. A method of producing a semiconductor device as defined by claim 10, further comprising a step for forming a barrier film made of tungsten or an alloy thereof.

12. A method of producing a semiconductor device as defined by claim 10, further comprising a step for forming a continuously extending second insulator film between said passivation film and said wiring portion and between said passivation film and a portion of said thin film resistor corresponding to said removed portion of said film for wiring, said second insulator film being made of an insulator including silicon.

13. A method of producing a semiconductor device as defined by claim 10, wherein said thin film resistor is made of an amorphous substance.

14. A method of producing a semiconductor device as defined by claim 10, wherein said thin film resistor contains chromium in a range between 20 and 50 atm % and tungsten in a range between 1 and 20 atm %.

15. A method of producing a semiconductor device as defined by claim 14, wherein said thin film resistor contains chromium in a range between 20 and 50 atm % and tungsten in a range between 2 and 14 atm %.

16. A method of producing a semiconductor device as defined by claim 11, wherein said barrier film contains tungsten in a range between 5 and 50 atm %.

17. A method of producing a semiconductor device as defined by claim 10, wherein said first insulator film and said passivation film are made of a insulator including silicon selected from a group of $SiO_x$, PSG, BSG, BPSG and SiN.

18. A method of producing a semiconductor device as defined by claim 12, wherein said second insulator film is made of a insulator including silicon selected from a group of $SiO_x$, PSG, BSG, BPSG and SiN.

19. A semiconductor device as defined in claim 4, wherein said thin film resistor is a single layer of said amorphous substance.

20. A semiconductor device as defined in claim 13, wherein said thin film resistor is a single layer of said amorphous substance.

21. A semiconductor device having a fuse whose state can be changed by an application of fusing energy, said fuse being a thin film resistor comprised of a layer of heat-fusible material containing chromium, silicon, and tungsten before application of fusing energy.

* * * * *